(12) United States Patent
Ellis-Monaghan et al.

(10) Patent No.: US 8,110,875 B2
(45) Date of Patent: Feb. 7, 2012

(54) STRUCTURE FOR CHARGE DISSIPATION DURING FABRICATION OF INTEGRATED CIRCUITS AND ISOLATION THEREOF

(75) Inventors: John Joseph Ellis-Monaghan, Grand Isle, VT (US); Jeffrey Peter Gambino, Westford, VT (US); Timothy Dooling Sullivan, Underhill, VT (US); Steven Howard Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 612 days.

(21) Appl. No.: 12/166,362

(22) Filed: Jul. 2, 2008

(65) Prior Publication Data

US 2008/0265422 A1 Oct. 30, 2008

Related U.S. Application Data

(62) Division of application No. 11/160,468, filed on Jun. 24, 2005, now Pat. No. 7,445,966.

(51) Int. Cl.
*H01L 23/62* (2006.01)

(52) U.S. Cl. ... 257/355; 257/347; 257/758; 257/E23.01; 438/622

(58) Field of Classification Search ............ 257/758, 257/E23.01, 347, 355; 438/622
See application file for complete search history.

(56) References Cited

U.S. PATENT DOCUMENTS

| | | | |
|---|---|---|---|
| 5,475,255 A | 12/1995 | Joardar et al. | |
| 5,994,742 A | 11/1999 | Krishnan et al. | |
| 6,097,045 A | 8/2000 | Min | |
| 6,274,886 B1 | 8/2001 | Sasaki et al. | |
| 6,458,634 B1 | 10/2002 | Stevens | |
| 6,589,823 B1 | 7/2003 | Beebe et al. | |
| 6,717,267 B1 | 4/2004 | Kunikiyo | |
| 6,818,956 B2 | 11/2004 | Kuo et al. | |
| 6,943,063 B2 | 9/2005 | Tasi et al. | |
| 6,992,002 B2 | 1/2006 | Dunham et al. | |
| 7,061,091 B2 | 6/2006 | Chiu | |
| 7,087,496 B2 | 8/2006 | Gutierrez | |
| 2002/0029853 A1 | 3/2002 | Hudson et al. | |
| 2002/0094625 A1 | 7/2002 | Hashimoto et al. | |
| 2002/0142526 A1 | 10/2002 | Khare et al. | |
| 2003/0045087 A1 | 3/2003 | Yoshie et al. | |
| 2003/0080435 A1 | 5/2003 | Dunham et al. | |
| 2004/0128636 A1 | 7/2004 | Ishikura | |
| 2004/0129977 A1* | 7/2004 | Ohkubo et al. ............... 257/347 |
| 2004/0150070 A1* | 8/2004 | Okada et al. ................. 257/508 |
| 2004/0263190 A1 | 12/2004 | Benjamin | |
| 2005/0104177 A1 | 5/2005 | Lin et al. | |

FOREIGN PATENT DOCUMENTS

JP 8330250 A 12/1996

* cited by examiner

*Primary Examiner* — Kenneth Parker
*Assistant Examiner* — John Lin
(74) *Attorney, Agent, or Firm* — Schmeiser, Olsen & Watts; Anthony J. Canale

(57) ABSTRACT

A structure for dissipating charge during fabrication of an integrated circuit. The structure includes: a substrate contact in a semiconductor substrate; one or more wiring levels over the substrate; one or more electrically conductive charge dissipation structures extending from a top surface of an uppermost wiring level of the one or more wiring levels through each lower wiring level of the one or more wiring levels to and in electrical contact with the substrate contact; and circuit structures in the substrate and in the one or more wiring layers, the charge dissipation structures not electrically contacting any the circuit structures in any of the one or more wiring levels, the one or more charge dissipation structures dispersed between the circuit structures.

20 Claims, 9 Drawing Sheets

STRUCTURE FOR CHARGE DISSIPATION DURING FABRICATION OF INTEGRATED CIRCUITS AND ISOLATION THEREOF

This Application is a division of U.S. patent application Ser. No. 11/160,468 filed on Jun. 24, 2005, now U.S. Pat. No. 7,445,966, issued Nov. 4, 2008.

FIELD OF THE INVENTION

The present invention relates to the field of integrated circuits; more specifically, it relates to method and structure for charge dissipation during fabrication of integrated circuits and isolation of circuits and structures in completed integrated circuits.

BACKGROUND OF THE INVENTION

Integrated circuits are liable to damage from electrostatic potential variations, electromagnetic interference (EMI), electrical overstress (EOS), and electrostatic discharge (ESD) during fabrication as well as during normal operation. During fabrication, one source of ESD is charge induced by the various plasma etch and plasma deposition processes. During fabrication, plasma processes can have non-uniform electrical fields and magnetic fields in a semiconductor tooling. Non-uniformities in the electrical field, and the plasma environments can lead to non-uniform charge deposition in a semiconductor wafer. Additionally, these voltage gradients can lead to plasma arcing. Voltage gradients that are established across a semiconductor wafer can lead to charge redistribution and damage to components on the wafer. After fabrication there are many potential sources of ESD, for example handling of the integrated circuit chips. A related type of ESD-like damage can occur between various sub-circuits and structures operating at different voltage levels during normal operation of the integrated circuit. Similarly electromagnetic induced (EMI) cross-talk between various circuits and structures during normal operations can cause damage to as well as failures of the integrated circuit.

Therefore, there is a need for a method and structure for charge dissipation during fabrication of integrated circuits and isolation of circuits and structures in completed integrated circuits.

SUMMARY OF THE INVENTION

A first aspect of the present invention is an integrated circuit chip, comprising: a substrate contact in a substrate; one or more wiring levels over the substrate; one or more electrically conductive charge dissipation structures extending from a top surface of an uppermost wiring level of the one or more wiring levels through each lower wiring level of the one or more wiring levels to and in electrical contact with the substrate contact; and circuit structures in the substrate and in the one or more wiring layers, the charge dissipation structures not electrically contacting any circuit structures in any of the one or more wiring levels, the one or more charge dissipation structures dispersed between the circuit structures.

A second aspect of the present invention is a method of fabricating an integrated circuit chip, comprising: forming a substrate contact in a substrate; forming one or more wiring levels over the substrate; forming one or more electrically conductive charge dissipation structures extending from a top surface of an uppermost wiring level of the one or more wiring levels through each lower wiring level of the one or more wiring levels to and in electrical contact with the substrate contact; and forming circuit structures in the substrate and in the one or more wiring levels, the charge dissipation structures not electrically contacting any the circuit structures in any of the one or more wiring levels, the one or more charge dissipation structures dispersed between the circuit structures.

A third aspect of the present invention is a method, comprising: placing integrated circuit element shapes comprising substrate contact, contact, single-damascene wire, dual-damascene wire or via shapes in a hierarchal set of design levels from a lowest to a highest design level of an integrated circuit chip; and placing charge dissipation structure shapes comprising additional substrate contact, additional contact, additional wire or additional via shapes in each design level of the hierarchal set of design levels, within each design level the charge dissipation structure shapes not contacting the integrated circuit element shapes, the charge dissipation shapes in each design level electrically connected to one another and not electrically connected to any contact, via or single-damascene wire shape of the integrated circuit element shapes in immediately lower design levels of the hierarchal set of design levels.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trenches or via openings are formed in a dielectric layer, an electrical conductor of sufficient thickness to fill the trenches is deposited on a top surface of the dielectric, and a chemical-mechanical-polish (CMP) process performed to remove excess conductor and make the surface of the conductor co-planer with the surface of the dielectric layer to form a damascene wires (or damascene vias). When only a trench and wire (or via opening and via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process performed to make the surface of the conductor in the trench co-planer with the surface the dielectric layer to form dual-damascene wires and dual-damascene wires having integral dual-damascene vias.

Fill shapes are single-damascene or dual-damascene structures made concurrently with single-damascene or dual-damascene wires and vias in a wiring level, but are not electrically connected to any wire or via contained in the same wiring level as the fill shape or normally to any wire, via or fill shape in other wiring levels.

Figure 1:
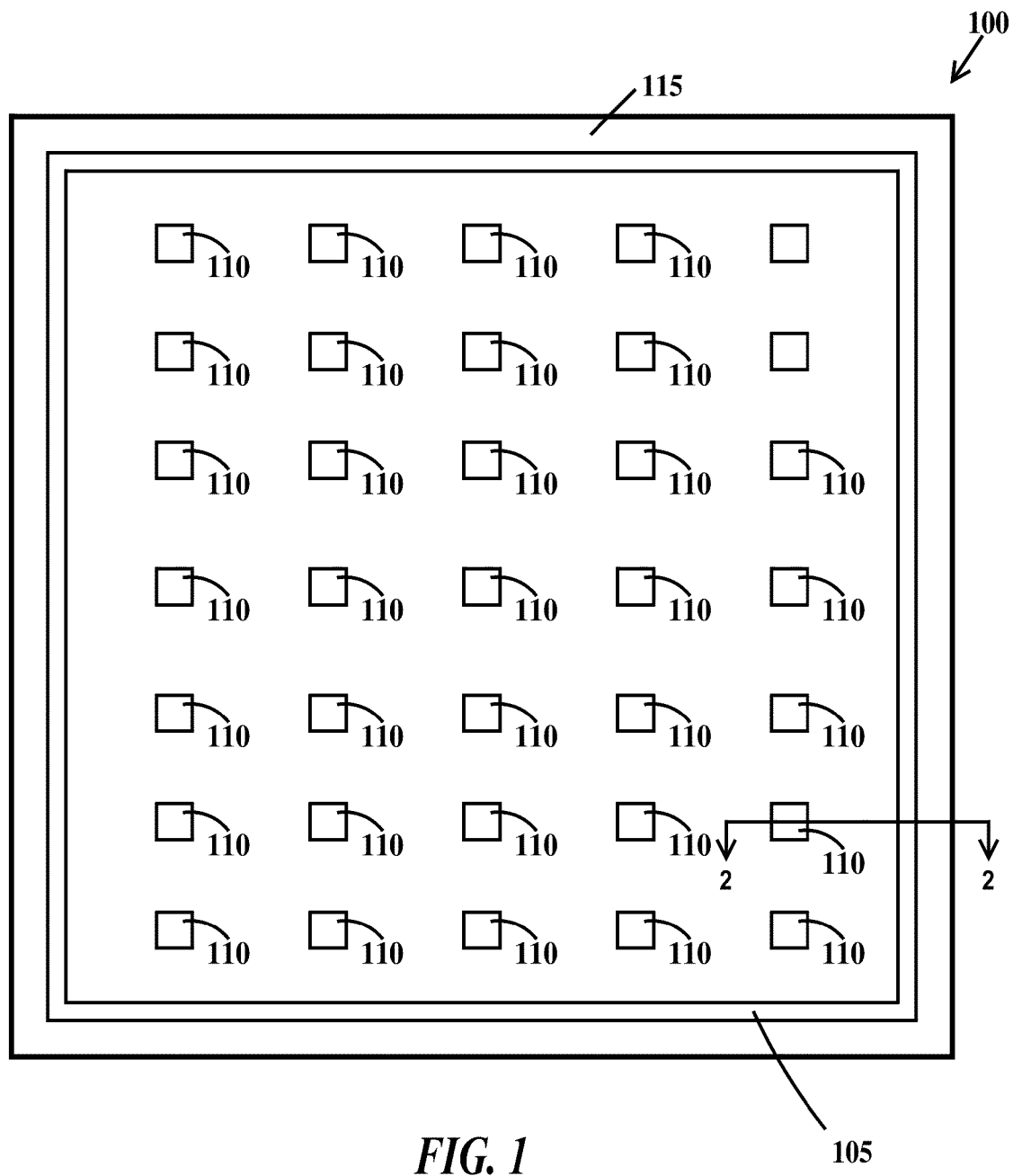
FIG. 1 is a top view of an integrated circuit chip prior to formation of terminals according a first embodiment of the present invention.

FIG. 1 is a top view of an integrated circuit chip prior to formation of terminals according a first embodiment of the present invention. In FIG. 1, an integrated circuit chip 100 includes an electrically conductive guard ring 105 located adjacent to but not abutting the periphery of integrated chip 100 and a multiplicity of electrically conductive charge dissipation structures 110 distributed throughout integrated circuit chip 100 within guard ring 105. Charge dissipation structures 110 are placed in a distributed fashion to reduce the voltage differential between any two points across integrated circuit chip 100. The placement of the charge dissipation structures 110 is to avoid electrical potential variations that can occur due to plasma non-uniformities, and reduce the likelihood of plasma arcing within integrated circuit chip 110. While charge dissipation structures 110 are illustrated as uniformly and symmetrically distributed within guard ring 105, charge dissipation structures 110 may be located randomly within guard ring 105.

Guard ring 105 forms a continuous vertical structure along the periphery of integrated circuit chip within each wiring level (as described infra) and extends from a top surface 115 of integrated circuit chip 100 to the substrate on which integrated circuit chip 100 is fabricated. Each charge dissipation structure forms a continuous vertical structure through each wiring level (as described infra) and extends from top surface of integrated circuit chip 100 to the substrate on which integrated circuit chip 100 is fabricated at each wiring level of integrated circuit chip 100.

Figure 2:
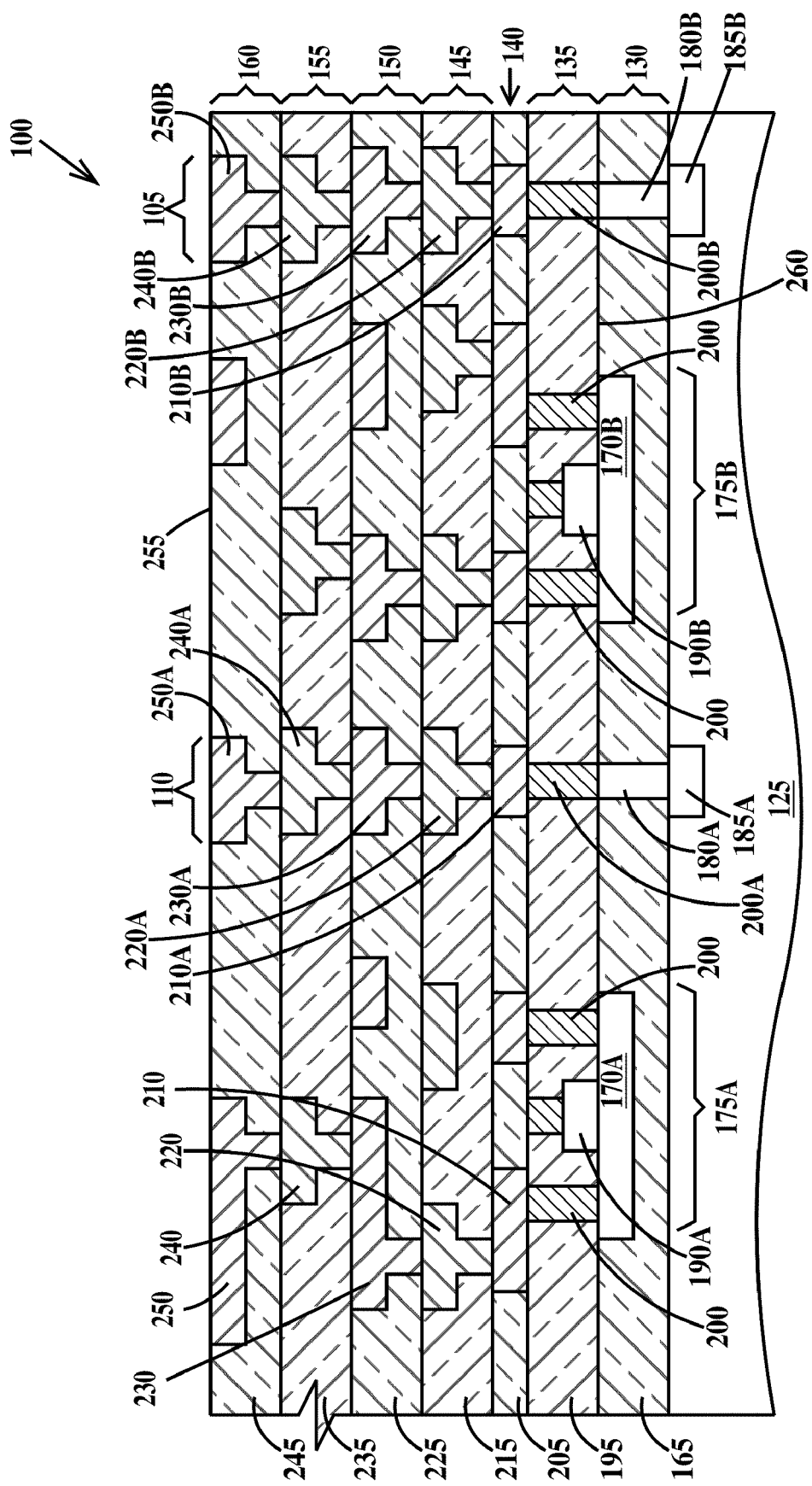
FIG. 2 is a cross-sectional view through line 2-2 of FIG. 1.

FIG. 2 is a cross-sectional view through line 2-2 of FIG. 1. In FIG. 2, integrated circuit chip 100 comprises a substrate 125, a buried oxide (BOX) level 130 formed on the substrate, a contact level 135 formed on the BOX level, a first wiring level 140, formed on the contact level, a second wiring level 145 formed on the first wiring level, a third wiring level 150 formed on the second wiring level, a fourth wiring level 155 formed on the third wiring level and a fifth wiring level 160 formed on the fourth wiring level. There may be more or less wiring levels than the five wiring levels illustrated in FIG. 2. In the example of FIG. 2, contact layer 135 and first wiring level 140 are formed by damascene processes, while second, third, fourth and fifth wiring levels 145, 150, 155 and 160 are formed by dual-damascene processes. Contact layer 135 and first, second, third, fourth and fifth wiring levels 140, 145, 150, 155 and 160 may be formed by any method known in the art.

During fabrication of SOI wafers, plasma processes can have non-uniform electrical fields and magnetic fields in a semiconductor tooling. Non-uniformities in the electrical field, and the plasma environments can lead to non-uniform charge deposition in a semiconductor wafer. Additionally, these voltage gradients can lead to plasma arcing. Voltage gradients that are established across a semiconductor wafer can lead to charge re-distribution and damage to components on the wafer. By placement of charge dissipation structures, the voltage gradients can be reduced and the charge dissipated.

In one example, substrate 125 is single crystal silicon. BOX layer 130 includes a buried oxide layer surrounding single crystal silicon islands 170A and 170B in which the source, drains and channel regions (not shown) of exemplary field effect transistors (FETs) 175A and 175B are formed. The combination of substrate 125 and BOX level 130 is also known as a silicon-on-insulator (SOI) substrate. The invention is applicable to integrated circuit chips fabricated on bulk silicon substrates, in which case BOX level 130 will not be present and the source, drains and channel regions (not shown) of FETs 175A and 175B would be formed in substrate 125.

Formed through BOX layer 130 from a top surface to a bottom surface of BOX layer 130 are polysilicon contacts 180A and 180B. Contacts 180A and 180B are in electrical contact with diffused substrate contact regions 185A and 185B of substrate 125 respectively. If substrate 125 is doped N type, then diffused substrate contact regions 185A and 185B are doped N type and polysilicon contacts 180A and 180B may also be doped N type. If substrate 125 is doped P type, then diffused substrate contact regions 185A and 185B are doped P type and polysilicon contacts 180A and 180B may also be doped P type.

Formed on top of silicon islands 170A and 170B are polysilicon gates 190A and 190B respectively. The gate dielectric between gate 190A and silicon island 170A and between gate 190B and silicon island 170B is not shown in FIG. 2.

Contact level 135 comprises a dielectric layer 195 and contacts 200. In one example, dielectric layer is boron-phosphorus-silicate glass (BPSG) and contacts 200 comprise tungsten. Contacts 200 extend from a top surface of dielectric layer through the dielectric layer to electrically contact source or drains in silicon islands 170A or 170B, gates 190A or 190B or contacts 180A or 180B. In one example, contact level 135 may be considered a wiring level, particularly when contacts 200 interconnect source, drains, gates and other structures of two or more FETs.

First wiring level 140 comprises a dielectric layer 205 and damascene wires or vias 210. Second wiring level 145 comprises a dielectric layer 215 and dual-damascene or damascene wires 220. Third wiring level 150 comprises a dielectric layer 225 and dual-damascene or damascene wires 230. Fourth wiring level 155 comprises a dielectric layer 235 and dual-damascene or damascene wires 240. Fifth wiring level 160 comprises a dielectric layer 245 and dual-damascene or damascene wires 250.

In one example, one or more of dielectric layers 205, 215, 225, 235 and 245 each independently comprise one or more layers of silicon nitride ($Si_3N_4$), silicon carbide (SiC), silicon oxy nitride (SiON), silicon oxy carbide (SiOC), hydrogen doped silica glass (SiCOH), plasma-enhanced silicon nitride ($PSiN_x$) or NBLok (SiC(N,H)).

In one example, one or more of dielectric layers 205, 215, 225, 235 and 245 each independently comprise a low K (dielectric constant) material, examples of which include but are not limited to hydrogen silsesquioxane polymer (HSQ), methyl silsesquioxane polymer (MSQ), SiLK ™ (polyphenylene oligomer) manufactured by Dow Chemical, Midland, Tex., Black Diamond ™ (SiO$_x$(CH3)$_y$) manufactured by Applied Materials, Santa Clara, Calif. A low K dielectric material has a relative permittivity of 4 or less.

In one example, wires and vias in wiring levels 140, 145, 150, 155 and 160 are formed from a conductive liner filled with a conductive core. In one example, the conductive liner comprises Ti, Ta, TiN, TaN or combinations thereof and the core conductor comprises Cu.

Charge dissipation structure 110 comprises a stack of diffused substrate contact region 185A, contact 180A, a contact 200A, a damascene wire 210A, a dual-damascene wire 220A, a dual-damascene wire 230A, dual-damascene wire 240A and dual-damascene wire 250A aligned vertically over one another. Electrical continuity is maintained from dual-damascene wire 250A through dual-damascene wire 240A, dual-damascene wire 230A, a dual-damascene wire 220A, damascene wire 210A, contact 200A, contact 180A to diffused substrate contact region 185A of substrate 125 as contact level 135 and each wiring level 140, 145, 150, 155 and 160 is fabricated. Charge dissipation structure 110 is not electrically connected to any other contact in contact level 135 or other wire in wiring levels 140, 145, 150, 155 or 160.

Guard ring 105 comprises a stack of diffused substrate contact region 185B, contact 180B, a contact 200B, a damascene wire 210B, a dual-damascene wire 220B, a dual-damascene wire 230B, a dual-damascene wire 240B and a dual-damascene wire 250B aligned vertically over one another. Electrical continuity is maintained from dual-damascene wire 250B through dual-damascene wire 240B, dual-damascene wire 230B, dual-damascene wire 220B, damascene wire 210D, contact 200B, contact 180B to diffused substrate contact region 185B of substrate 125 as contact level 135 and each wiring level 140, 145, 150, 155 and 160 is fabricated. However, contact 200B, damascene wire 210B, dual-damascene wire 220B, dual-damascene wire 230B, dual-damascene wire 240B and dual-damascene wire 250B extend laterally (in and out of the plane of the drawing) to form a continuous wall from a top surface 255 of wiring level 160 to a top surface 260 of BOX level 130 or to a top surface of substrate without breaks. Guard ring 105 is not electrically connected to any other contact in contact level 135 or other wire in wiring levels 140, 145, 150, 155 or 160.

After fabrication of wiring level 160, terminal pads may be formed electrically contacting one or more wires 250 as is known in the art. Alternatively, one or more of wires 250 may themselves be terminal pads.

Figure 3:
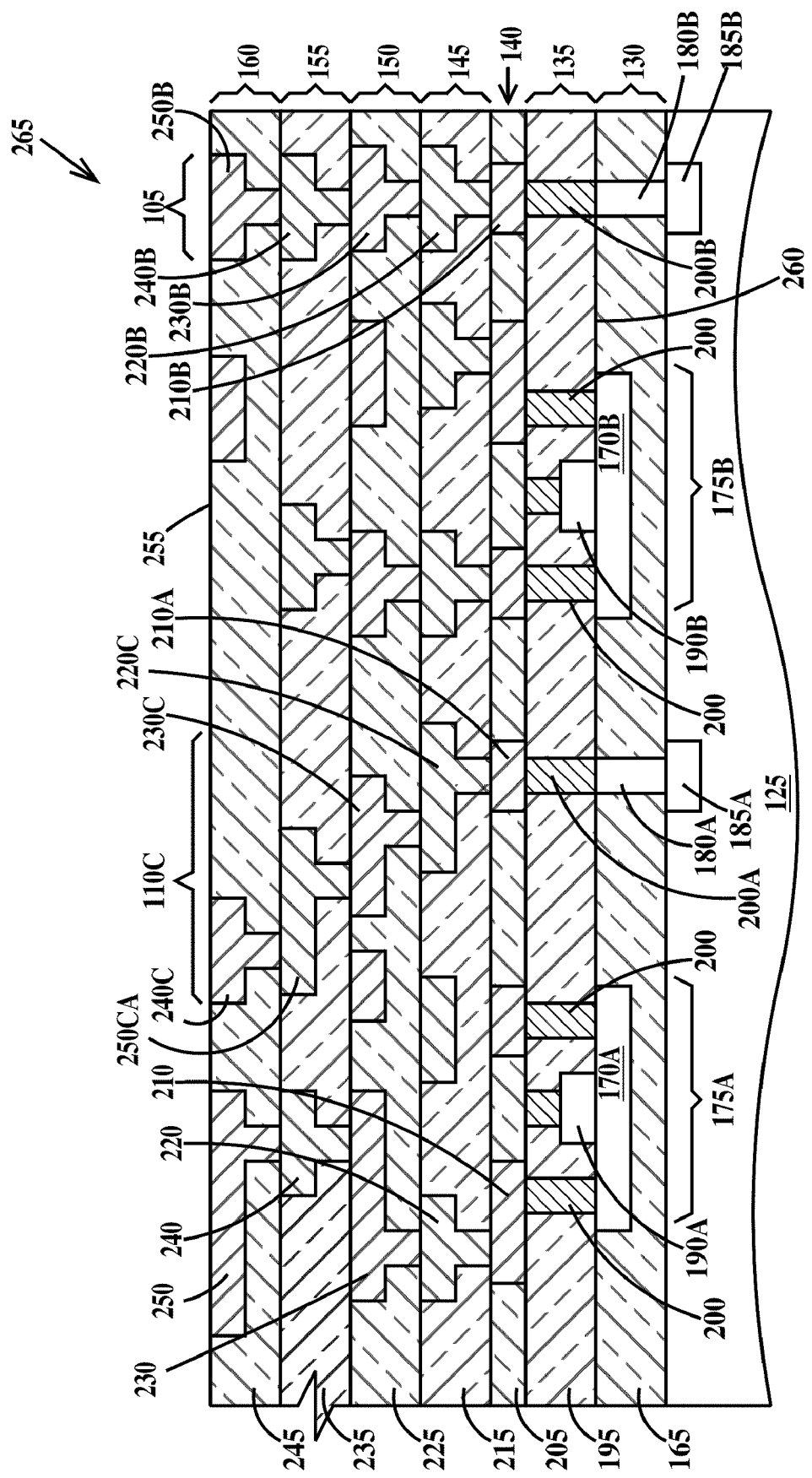
FIG. 3 is a cross-sectional view through an integrated circuit prior to formation of terminals according a variation of the first embodiment of the present invention.

FIG. 3 is a cross-sectional view through an integrated circuit prior to formation of terminals according a variation of the first embodiment of the present invention. In FIG. 3, an integrated circuit chip 265 is similar to integrated circuit chip 100 of FIG. 2, except for a charge dissipation structure 110C which comprises a stack of diffused substrate contact region 185A, contact 180A, contact 200A, damascene wire 210A, a dual-damascene wire 220C, a dual-damascene wire 230C, dual-damascene wire 240C and dual-damascene wire 250C which are not vertically aligned over each other as in charge dissipation structure 110 of FIG. 2, but rather form a meandering or zigzag path from top surface 255 to substrate 125.

Figure 4:
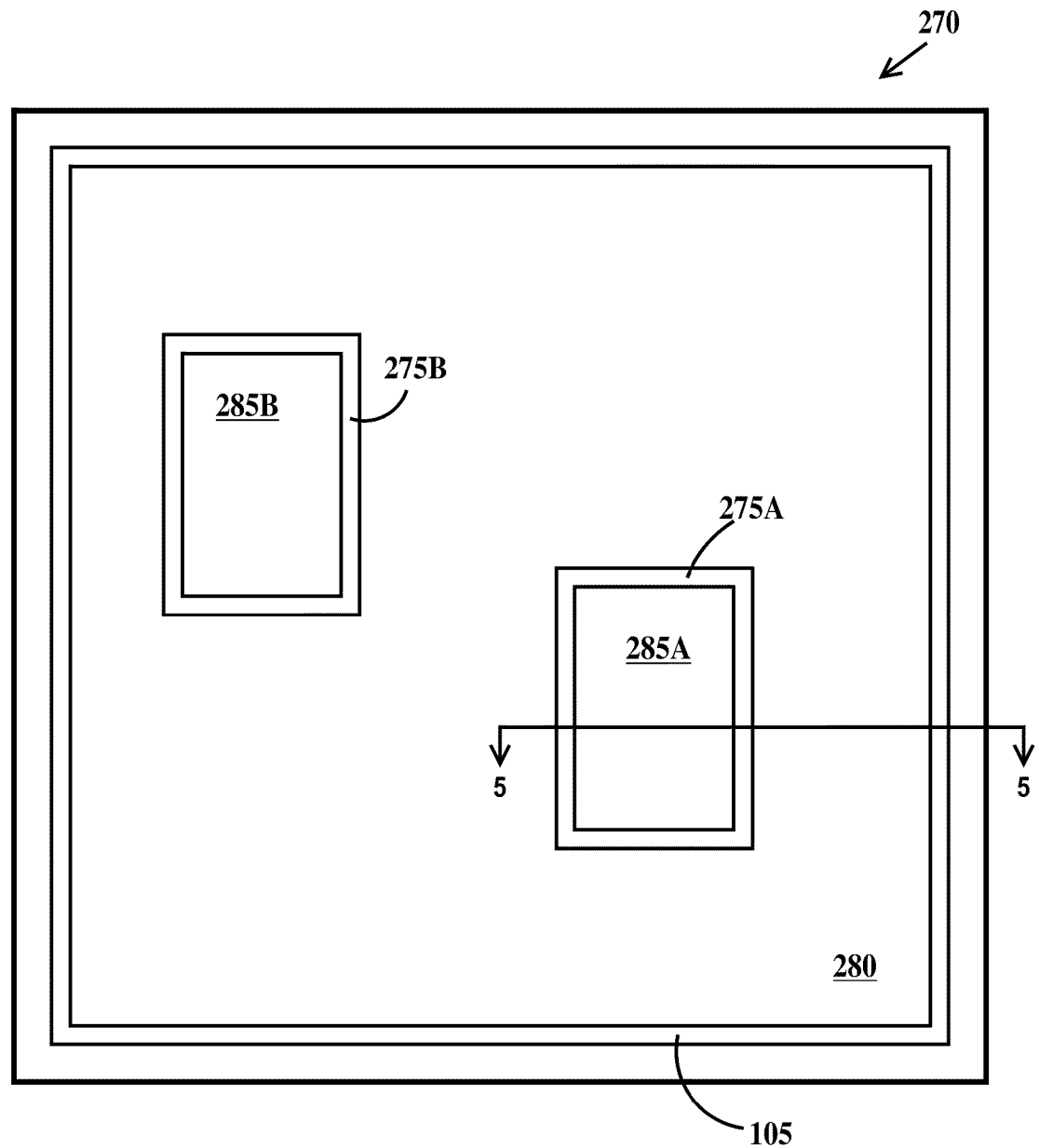
FIG. 4 is a top view of an integrated circuit chip prior to formation of terminals according a second embodiment of the present invention.

FIG. 4 is a top view of an integrated circuit chip prior to formation of terminals according a second embodiment of the present invention. In FIG. 4, an integrated circuit 270 includes guard ring 105 and internal guard rings 275A and 275B. Internal guard rings 275A and 275B are similar to guard ring 105 except internal guard rings 275A and 275B are nested within guard ring 105. There is an integrated circuit region 280 between guard ring 275A (and 275B) and guard ring 105. There are also integrated circuit regions 285A and 285B within guard rings 275A and 275B respectively. Guard rings 275A and 275B offer additional ESD protection to integrated circuit regions 285A and 285B respectively, during and after fabrication of integrated circuit 270 and provide isolated regions of integrated circuit 270.

In one example, internal guard rings 275A and 275B form an unbroken, continuous and electrically conductive wall around wires, FETs and other structures within internal guard rings 275A and 275B. In one example, a limited number of openings may be made in guard rings 275A and 275B at one or more wiring levels to allow power and signal wires to connect circuit elements in regions 275A and 275B to circuit elements in region 280. However, the less opening and penetrations, the more effective guard rings 275A and 275B will be in providing ESD protection and/or isolation.

Figure 5:
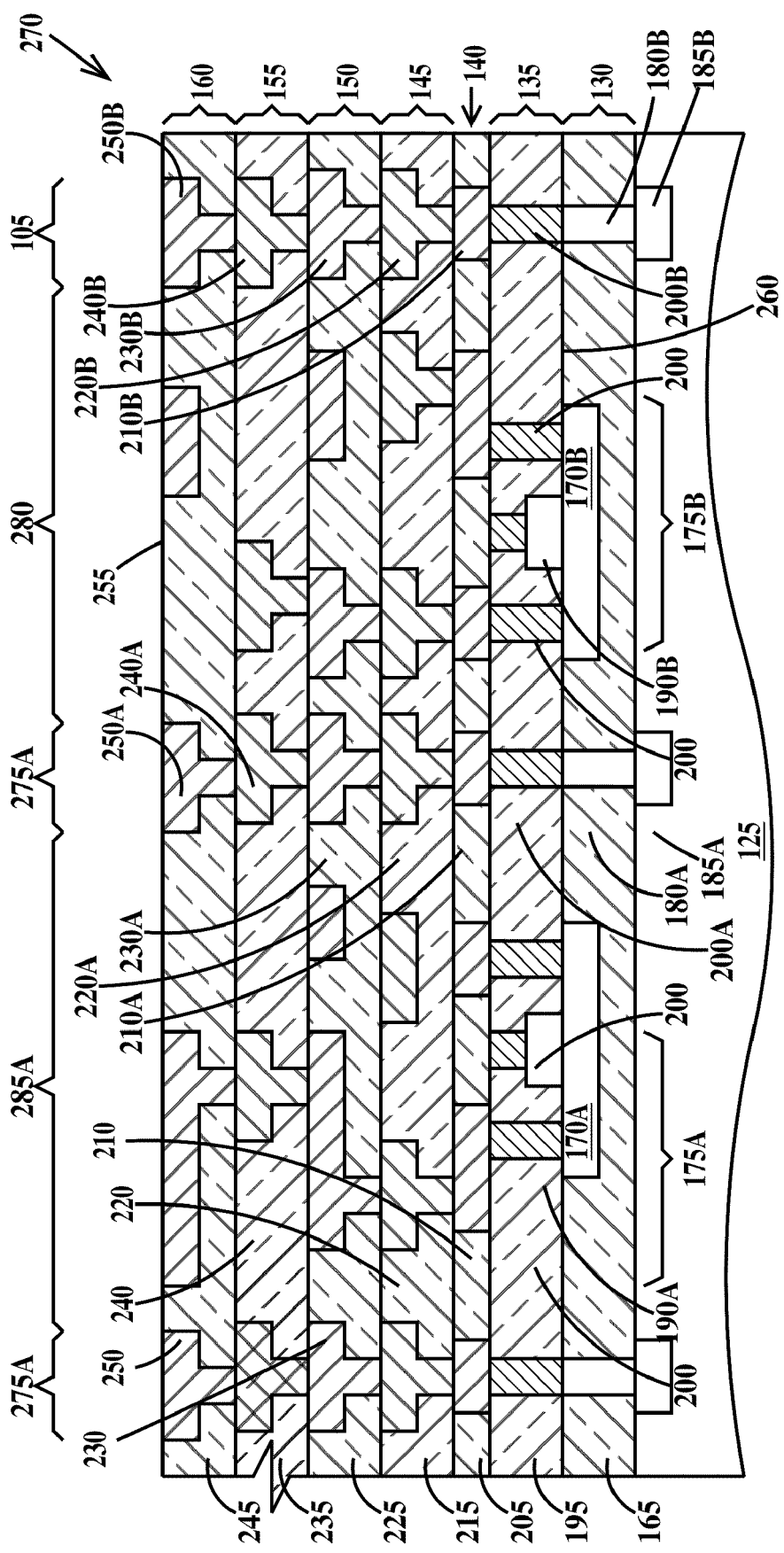
FIG. 5 is a cross-sectional view through line 5-5 of FIG. 4.

FIG. 5 is a cross-sectional view through line 5-5 of FIG. 4. In FIG. 5, integrated circuit region 285A is surrounded by internal guard ring 275A. Integrated circuit region 285A includes FET 175A and wires 210, 220, 230, 240 and 250. A portion of integrated circuit region 280 is shown between inner guard ring 275A and guard ring 105. Integrated circuit region 280 includes FET 175B and associated wires in wiring levels 145, 150, 155 and 160.

In FIGS. 4 and 5, guard rings 275A and 275B are not electrically connected to guard ring 105 except both contact regions of substrate 125, that may or may not be electrically connected. Optionally, one or both of guard rings 275A and 275B may be electrically connected to guard ring 105 by one or more wires formed in wiring levels 145, 150, 155 and 160.

Figure 6:
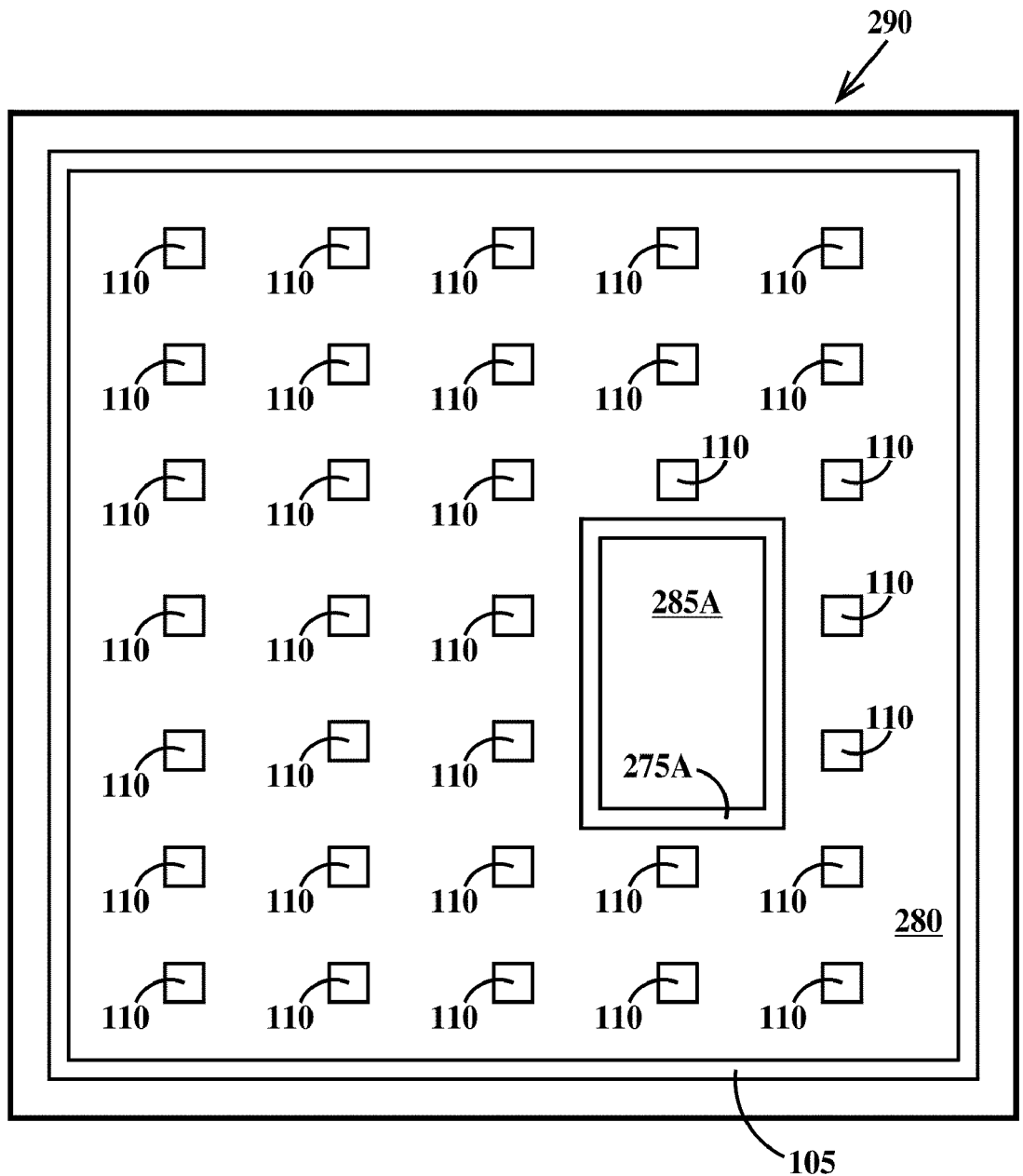
FIG. 6 is a top view of an integrated circuit chip prior to formation of terminals according a third embodiment of the present invention.

FIG. 6 is a top view of an integrated circuit chip prior to formation of terminals according a third embodiment of the present invention. The third embodiment of the present invention is a combination of the first and second embodiments of the present invention. In FIG. 6, an integrated circuit chip 290 includes guard ring 105, charge dissipation structures 110 distributed throughout a region 280 of integrated circuit chip 290, and internal guard ring 275A surrounding region 285A of integrated circuit chip 290.

Figure 7:
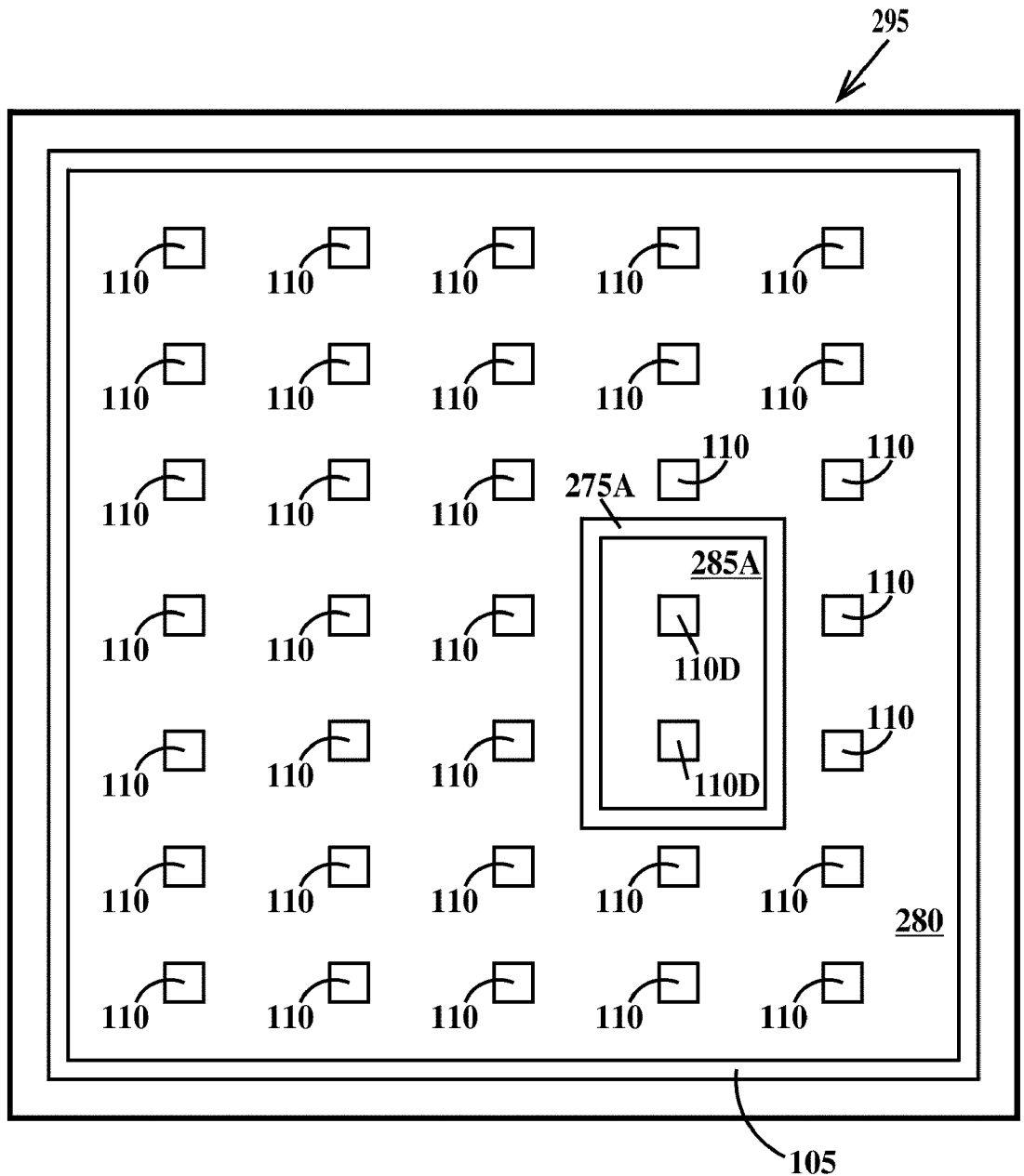
FIG. 7 is a top view of an integrated circuit chip prior to formation of terminals according fourth embodiment of the present invention.

FIG. 7 is a top view of an integrated circuit chip prior to formation of terminals according a fourth embodiment of the present invention. The fourth embodiment of the present invention is a combination of the first and second embodiments of the present invention. In FIG. 7, an integrated circuit chip 295 includes guard ring 105, charge dissipation structures 110 distributed throughout a region 280 of integrated circuit chip 295, and internal guard ring 275A surrounding region 285A of integrated circuit chip 290. Within internal guard ring 275A are charge dissipation structures 110D, which are similar to charge dissipation structures 110.

Figure 8:
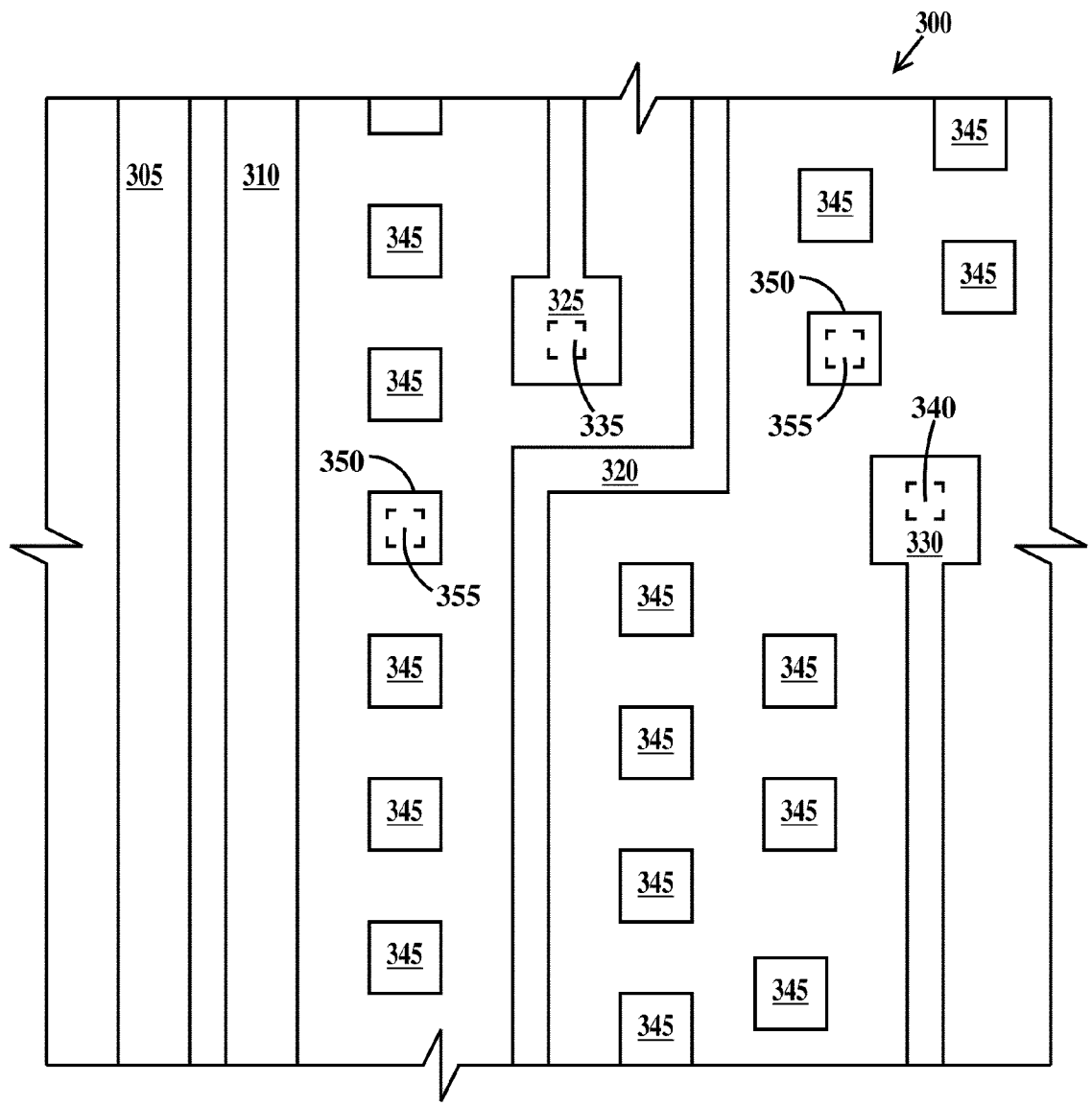
FIG. 8 is a top view illustrating incorporation of dummy fill shapes into the embodiments of the present invention.

FIG. 8 is a top view illustrating incorporation of dummy fill shapes into the embodiments of the present invention. In FIG. 8, an integrated circuit wiring level 300 includes damascene wires 305, 310 and 320 and dual-damascene wires 325 and 330. Dual-damascene wires 325 and 330 include integral vias 335 and 340 respectively. Wiring level 330 also includes a multiplicity of damascene fill shapes 345. Fills shapes are defined supra. Wiring level 330 is exemplary of wiring levels 145, 150, 155 and 160 of FIGS. 2, 3 and 5 (also contact level 135 and wiring level 140 if adjustments is made for the fact that contact level 135 and wiring level 140 are a single-damascene level) when they include fill shapes. (There is no requirement that a level include fill shapes.)

By addition of an integral via 350 to fill shapes 355, fill shapes 355 can be used as part of the wiring stacks making up charge dissipation structures 110 of FIG. 2, or charge dissipation structures 110C of FIG. 3.

An integrated circuit design includes a hierarchal set of mask design levels from a lowermost level to an uppermost level. The lower levels define features formed in or on the substrate and upper levels define features in wiring levels.

Figures 9, 10:
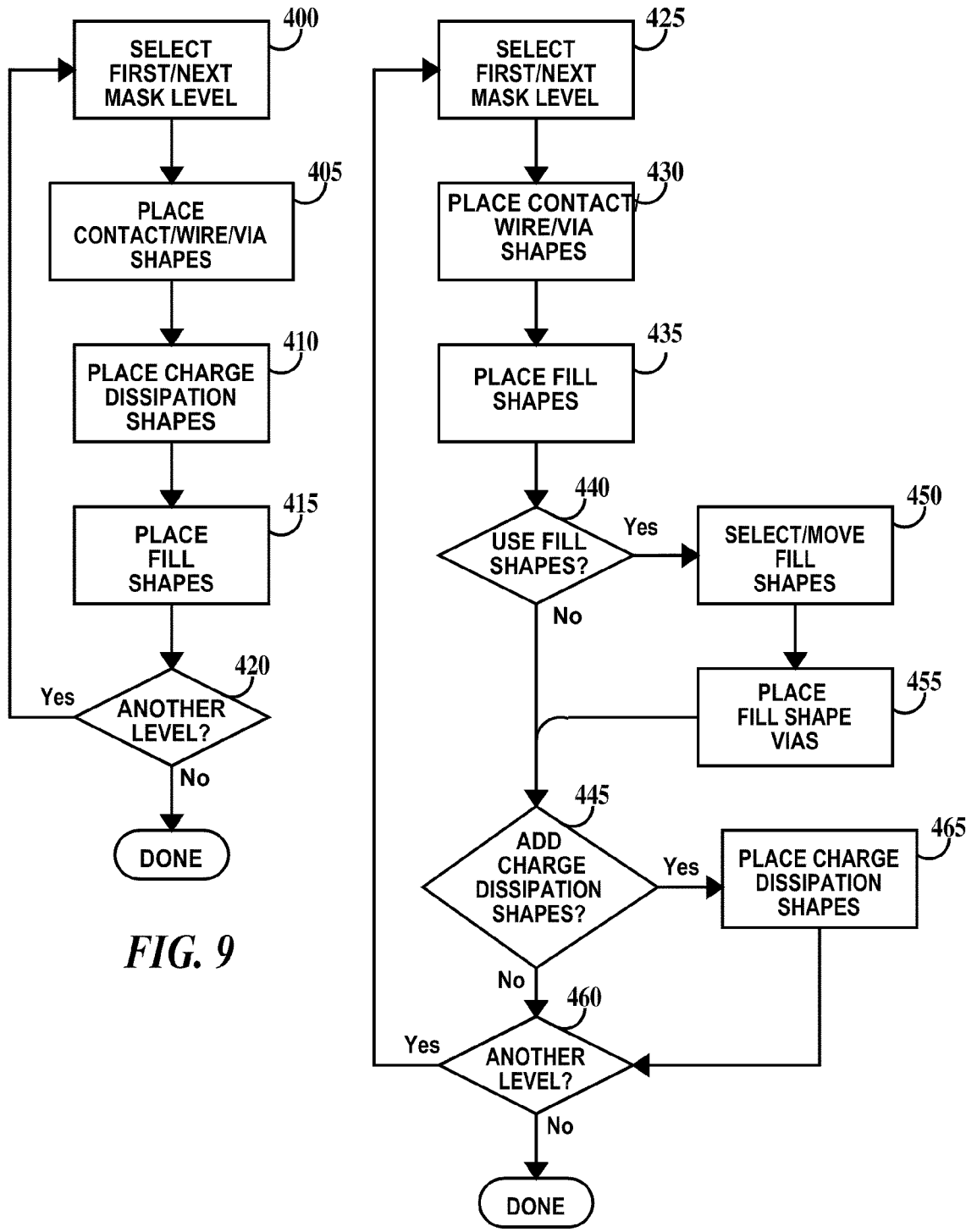
FIG. 9 is a flowchart of a first method of designing an integrated circuit chip according to the embodiments of the present invention;.
FIG. 10 is a flowchart of a second method of designing an integrated circuit chip according to the embodiments of the present invention.

FIG. 9 is a flowchart of a first method of designing an integrated circuit chip according to the embodiments of the present invention. In step 400, the first/next mask design level of an integrated circuit chip is selected. It should be understood for dual-damascene wiring levels, two mask levels must be designed, a trench (wire) level and a via opening (via) level, while contact levels, being single-damascene levels, only require a single mask level be designed. In step 405 contact, wiring or via shapes are placed (e.g. X-Y coordinates on a grid of the integrated circuit chip are assigned to the design shapes representing actual contacts wires and vias that will be fabricated from photomasks built from this design process). In step 410, the charge dissipation shapes (or internal guard ring) shapes needed in the current mask design level are placed. In step 415, optional fill shapes, if required, are placed into the current mask design level. If no fill shapes are to be placed, the method would skip to step 420. In step 420, it is determined if there is another mask level to design. If there is another mask level to design the method loops back to step 400, otherwise the method is complete.

After mask design is complete, the individual masks needed to fabricate an integrated circuit according to the present invention may be fabricated.

FIG. 10 is a flowchart of a second method of designing an integrated circuit chip according to the embodiments of the present invention. The second method includes using fill shapes in one or more mask levels to form sections of the charge dissipation or internal guard ring structures.

In step 425, the first/next mask design level of an integrated circuit chip is selected. In step 430 contact, wiring or via shapes are placed. In step 435, optional fill shapes, if required, are placed into the current mask design level. If no fill shapes are to be placed the method proceeds to step 445 otherwise the method proceeds to step 440. In step 440, it is determined if previously placed fill shapes are to be used as part of a charge dissipation structure. If previously placed fill shapes are to be used as part of a charge dissipation structure, then the method proceeds to step 450 otherwise the method proceeds to step 445. In step 450, the fill shapes to be used as part of a charge dissipation structure are selected, and if necessary, their positions adjusted so as to align with other parts of the charge dissipation structure in other mask levels. Then in step, 455, vias are placed in the via mask design corresponding to the current wire mask design and the method proceeds to step 445. In step 445, it is determined if charge dissipation shapes are to be added to the current mask level. If charge dissipation shapes are not to be added, then the method proceeds to step 460, otherwise the method proceeds to step 465. In step 465, the charge dissipation shapes (or internal guard ring) shapes needed in the current mask design level are placed and the method proceeds to step 460. In step 460, if there is another mask level to design the method loops back to step 425, otherwise the method is complete.

Note that adding charge dissipation shapes and employing fill shapes to be used as sections of charge dissipation structures may both be used in the same mask level.

After mask design is complete, the individual masks needed to fabricate an integrated circuit according to the present invention may be fabricated. Further, should be understood, that the steps illustrated in FIGS. 9 and 10 describe only those mask levels required for forming charge dissipation or internal guard rings according to the various embodiments of the present invention and other mask levels are required to be designed to complete a full mask set for manufacturing an integrated circuit chip.

Thus, the embodiments and variations of the embodiments of the present invention provide for a method and structure for charge dissipation during fabrication of integrated circuits and isolation of circuits and structures in completed integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit chip, comprising:
    a plurality of substrate contacts in a semiconductor substrate;
    two or more wiring levels over said substrate;
    a plurality of electrically conductive, vertical or angled columnar, charge dissipation structures, each charge dissipation structure of said plurality of charge dissipation structures extending from a top surface of an uppermost wiring level of said two or more wiring levels through each lower wiring level of said two or more wiring levels to and in electrical contact with a respective substrate contact of said plurality of substrate contact, said charge dissipation structures distributed within a perimeter of said integrated circuit chip; and
    a plurality of circuit structures in said substrate, said charge dissipation structures interspersed between and not in electrical contact with any of said plurality of circuit structures, and being commonly connected.

2. The integrated circuit chip of claim 1, further including:
    a peripheral substrate contact comprising a doped peripheral region of said substrate; and
    an electrically conductive peripheral guard ring extending from a top surface of an uppermost wiring level of said two or more wiring levels through each wiring level of said two or more wiring levels to and in electrical contact with said peripheral substrate contact, said peripheral guard ring extending along and located adjacent to but not abutting a periphery of said integrated circuit chip in each wiring level of said two or more wiring levels, said peripheral guard ring not in electrical contact with any of said circuit structures.

3. The integrated circuit chip of claim 2, wherein said peripheral substrate contact extends along and is located adjacent to but not abutting a periphery of said integrated circuit chip.

4. The integrated circuit chip of claim 2, further including:
    a ring shaped and doped semiconductor internal substrate contact in a semiconductor region of said substrate;
    a ring shaped electrically conductive internal guard ring extending from a top surface of an uppermost wiring level of said two or more wiring levels through each wiring level of said two or more wiring levels to and in electrical contact with said internal substrate contact, said internal guard ring located within said peripheral guard ring, said internal guard ring not in electrical contact with any of said circuit structures in any of said one or more wiring levels;

one or more of said plurality of circuit structures located between said internal guard ring and said peripheral guard ring; and one or more of said plurality of circuit structures located within said internal guard ring.

5. The integrated circuit chip of claim 4, including:

one or more of said plurality of charge dissipation structures located within said internal guard ring.

6. The integrated circuit chip of claim 1, wherein said substrate is a silicon-on-insulator substrate or a bulk silicon substrate.

7. The integrated circuit chip of claim 1, wherein a least a portion of said plurality of circuit structures have a region formed in said lowermost wiring level of said two or more wiring levels.

8. The integrated circuit chip of claim 1, wherein:

said substrate is a silicon-on-insulator substrate comprising an upper silicon layer separated from a lower semiconductor substrate by a buried oxide layer;

said plurality of circuit structures are formed in said upper silicon layer;

said plurality of substrate contacts are formed in said lower semiconductor substrate; and said plurality of charge dissipation structures each including an electrically conductive contact extending from said lowermost layer of said plurality of wiring levels through said buried oxide layer to respective substrate contacts formed in said lower semiconductor substrate.

9. The integrated circuit chip of claim 8, wherein said plurality of circuit structures are electrically isolated from said plurality of substrate contacts by said buried oxide layer and dielectric layers of said two or more wiring levels.

10. The integrated circuit chip of claim 8, further including a peripheral substrate contact comprising a doped peripheral region of said lower semiconductor substrate; and an electrically conductive peripheral guard ring extending from a top surface of an uppermost wiring level of said two or more wiring levels through each wiring level of said two or more wiring levels, said peripheral guard ring in physical and electrical contact with a peripheral through contact, said peripheral through contact extending through said buried oxide layer and in physical and electrical contact with said peripheral substrate contact, said peripheral guard ring extending along and located adjacent to but not abutting a periphery of said integrated circuit chip, said peripheral guard ring not in electrical contact with any of said circuit structures.

11. The integrated circuit chip of claim 10, further including:

a ring shaped doped internal substrate contact in said lower semiconductor substrate;

a ring shaped electrically conductive internal guard ring extending from a top surface of an uppermost wiring level of said two or more wiring levels through each wiring level of said two or more wiring levels, said internal guard ring in physical and electrical contact with a ring shaped through contact, said through contact extending through said buried oxide layer and in physical and electrical contact with said internal substrate contact, said internal guard ring located within said peripheral guard ring, said internal guard ring not electrically contacting any said circuit structures in any of said one or more wiring levels;

one or more of said plurality of circuit structures located between said internal guard ring and said peripheral guard ring; and one or more of said plurality of circuit structures located within said internal guard ring.

12. The integrated circuit chip of claim 11, including:

one or more of said plurality of charge dissipation structures located within said internal guard ring.

13. The integrated circuit of claim 1, wherein one or more of said plurality of device structures are field effect transistors.

14. The integrated circuit of claim 1, wherein said charge dissipation structures comprise wires formed in said wiring levels and respective wires of each charge dissipation structure of said plurality of said charge dissipation structures are aligned over each other.

15. The integrated circuit of claim 1, wherein said charge dissipation structures comprise wires formed in said wiring levels and respective wires of each charge dissipation structure of said plurality of said charge dissipation structures are not aligned over each other.

16. The integrated circuit of claim 1, wherein said charge dissipation structures comprise wires formed in said wiring levels and respective wires of each charge dissipation structure of a less than whole first portion of said plurality of said charge dissipation structures are aligned over each other and a less than whole second portion of said plurality of said charge dissipation structures are not aligned over each other.

17. The integrated circuit of claim 1, wherein said charge dissipation structures comprise wires formed in said wiring levels and wires in at least one of said wiring levels are damascene wires.

18. The integrated circuit of claim 1, wherein said charge dissipation structures comprise wires formed in said wiring levels and wires in at least one of said wiring levels are dual-damascene wires.

19. The integrated circuit of claim 1, wherein said charge dissipation structures comprise wires formed in respective dielectric layers of said wiring levels and said wires in one or more of said plurality of wiring levels comprise an electrically conductive core of copper and an electrically conductive liner of titanium, tantalum, titanium nitride, tantalum nitride or combinations thereof.

20. The integrated circuit of claim 1, wherein said charge dissipation structures comprise wires formed in respective dielectric layers of said wiring levels and one or more of said dielectric layers has a relative permittivity of 4 or less.

* * * * *